United States Patent

Nagasaka

[11] Patent Number: 5,897,724
[45] Date of Patent: *Apr. 27, 1999

[54] METHOD OF PRODUCING A HYBRID INTEGRATED CIRCUIT

[75] Inventor: Takashi Nagasaka, Anjo, Japan

[73] Assignee: Nippondenso Co., Ltd., Kariya, Japan

[*] Notice: This patent is subject to a terminal disclaimer.

[21] Appl. No.: 08/808,501

[22] Filed: Feb. 27, 1997

Related U.S. Application Data

[60] Continuation of application No. 08/325,608, Oct. 19, 1994, abandoned, which is a division of application No. 08/089,606, Jul. 12, 1993, Pat. No. 5,383,093, which is a continuation of application No. 07/275,710, Nov. 28, 1988, abandoned, which is a continuation of application No. 07/050,033, May 15, 1987, abandoned.

[30] Foreign Application Priority Data

May 19, 1986 [JP] Japan .................................. 61-114415
Mar. 26, 1987 [JP] Japan .................................. 62-72856

[51] Int. Cl.⁶ ............................. B32B 31/26; H05K 7/10
[52] U.S. Cl. ..................................... 156/89.18; 156/89.19; 156/89.21; 156/280; 29/851; 29/854; 427/96; 427/98; 361/751; 174/257
[58] Field of Search ............................. 156/89, 279, 280, 156/89.16, 89.18, 89.19, 89.21; 264/614, 618, 619; 174/257, 258, 260, 261; 29/846, 851, 854; 361/751, 761; 427/103, 96, 98

[56] References Cited

U.S. PATENT DOCUMENTS

| | | |
|---|---|---|
| 2,179,960 | 11/1939 | Schwarzkopf . |
| 3,770,874 | 11/1973 | Krieger et al. .................. 174/257 |
| 3,781,596 | 12/1973 | Galli . |
| 3,838,204 | 9/1974 | Ahn . |

(List continued on next page.)

FOREIGN PATENT DOCUMENTS

| | | |
|---|---|---|
| 50-58924 | 6/1975 | Japan . |
| 55-122666 | 9/1980 | Japan . |
| 56-10292 | 2/1981 | Japan . |
| 57-147295 | 9/1982 | Japan . |
| 58-130590 | 8/1983 | Japan . |
| 58-220496 | 12/1983 | Japan . |
| 60-84711 | 5/1985 | Japan . |
| 60-176297 | 9/1985 | Japan . |
| 60-201688 | 10/1985 | Japan . |
| 60-217696 | 10/1985 | Japan . |
| 60-22693 | 1/1986 | Japan . |
| 61-49496 | 3/1986 | Japan . |
| 61-224397 | 10/1986 | Japan . |
| 61-236192 | 10/1986 | Japan . |
| 63-42879 | 8/1988 | Japan . |
| 63-438779 | 9/1988 | Japan . |
| A2125618 | 3/1984 | United Kingdom . |

OTHER PUBLICATIONS

European Search Report dated Sep. 16, 1988.
Kirk–Othmer, John, "Electroless Plating", Encyclopedia of Chemical Technology, vol. 8, Wiley & Sons, Inc. 1979, pp. 738–749.

*Primary Examiner*—Curtis Mayes
*Attorney, Agent, or Firm*—Pillsbury Madison & Sutro LLP

[57] ABSTRACT

A multilayer substrate is constituted by laminating a plurality of sheet substrates, the respective sheet substrates are constituted by forming conductive layers of a refractory metal such as W on ceramic green sheets composed mainly of an alumina ceramic, and the ceramic green sheets are laminated and sintered to constitute the multilayer substrate. Porous conductive material layers are formed on the surface of the multilayer substrate so as to be selectively connected to the conductive layers, and copper-plated layers are formed on the porous conductive material layers. Thick film conductor layers are formed on the copper-plated layers to constitute terminal conductors, and, a thick film resistor layer for example is connected to the terminal conductors.

14 Claims, 8 Drawing Sheets

U.S. PATENT DOCUMENTS

| | | |
|---|---|---|
| 4,024,629 | 5/1977 | Lemoine et al. . |
| 4,109,377 | 8/1978 | Blazick et al. . |
| 4,248,921 | 2/1981 | Steigerwald et al. . |
| 4,424,409 | 1/1984 | Kuttner . |
| 4,521,449 | 6/1985 | Arnold . |
| 4,529,835 | 7/1985 | Mizuno . |
| 4,549,043 | 10/1985 | Kalubowila et al. . |
| 4,568,562 | 2/1986 | Phillips . |
| 4,576,735 | 3/1986 | Kuroki et al. . |
| 4,594,473 | 6/1986 | Inoue et al. . |
| 4,604,496 | 8/1986 | Ishihara et al. . |
| 4,610,758 | 9/1986 | Wilson . |
| 4,640,739 | 2/1987 | Modic et al. . |
| 4,641,425 | 2/1987 | Dubuisson et al. . |
| 4,652,977 | 3/1987 | Jones . |
| 4,713,494 | 12/1987 | Oikawa et al. ............ 174/257 |
| 5,296,649 | 3/1994 | Kusuga . |
| 5,383,093 | 1/1995 | Nagasaka et al. ............ 361/771 |

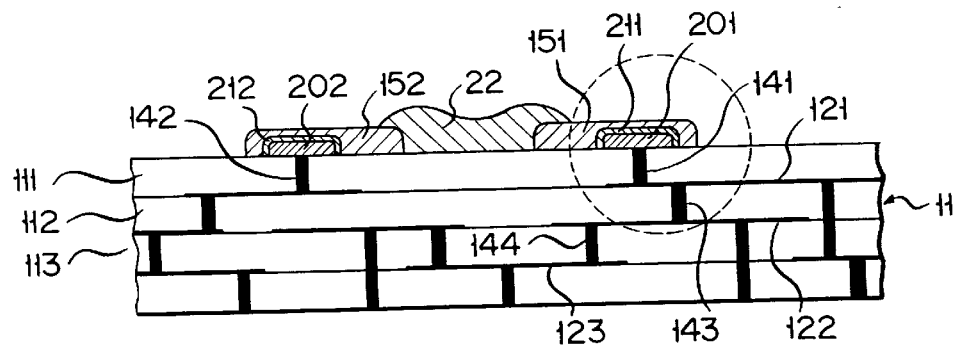
F I G. 2
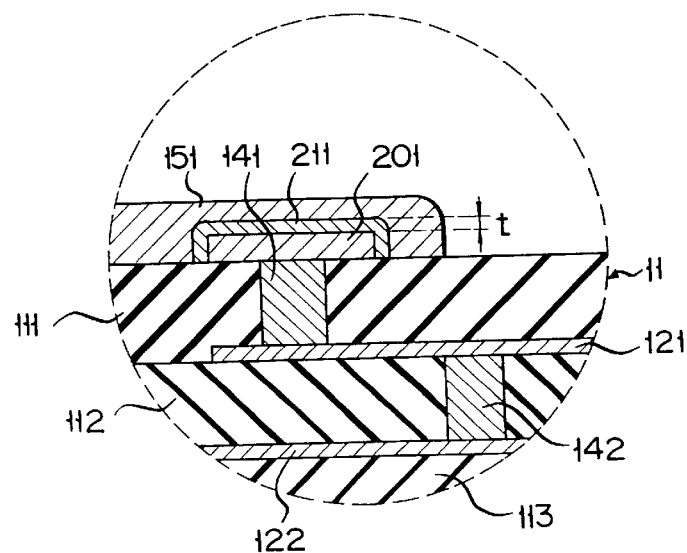
F I G. 2A

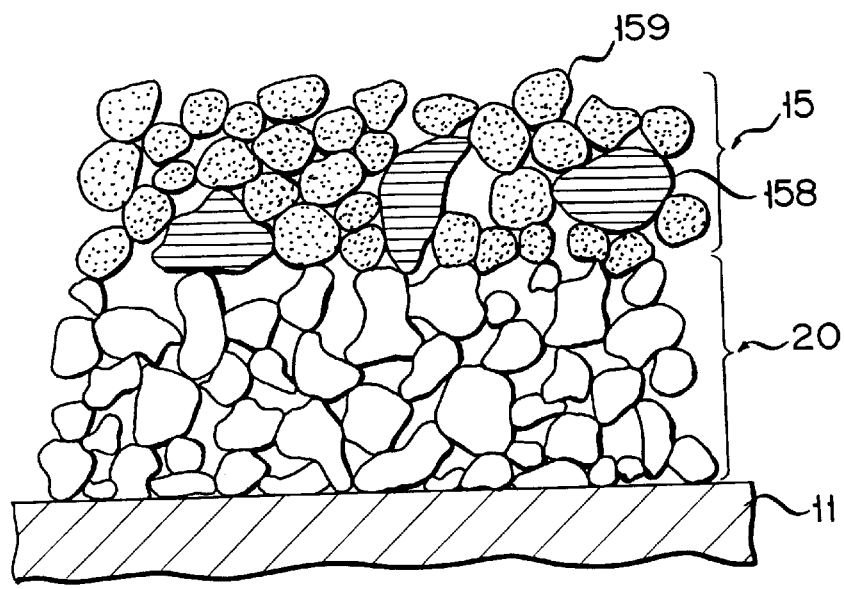
F I G. 5A
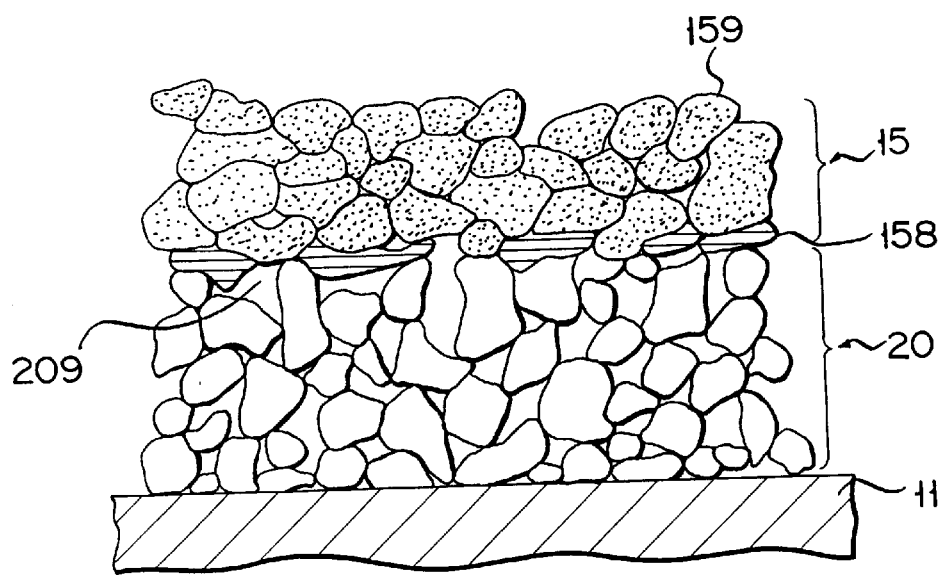
F I G. 5B

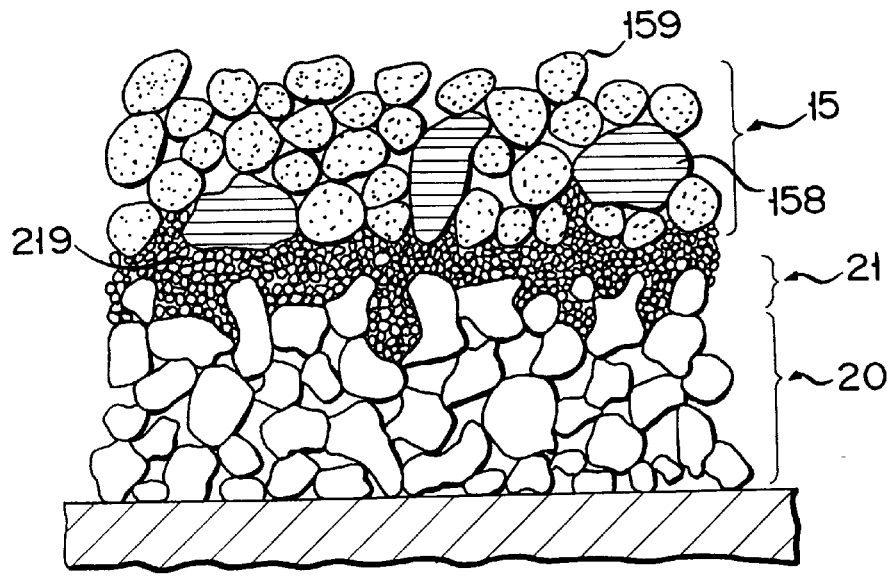
F I G. 6A
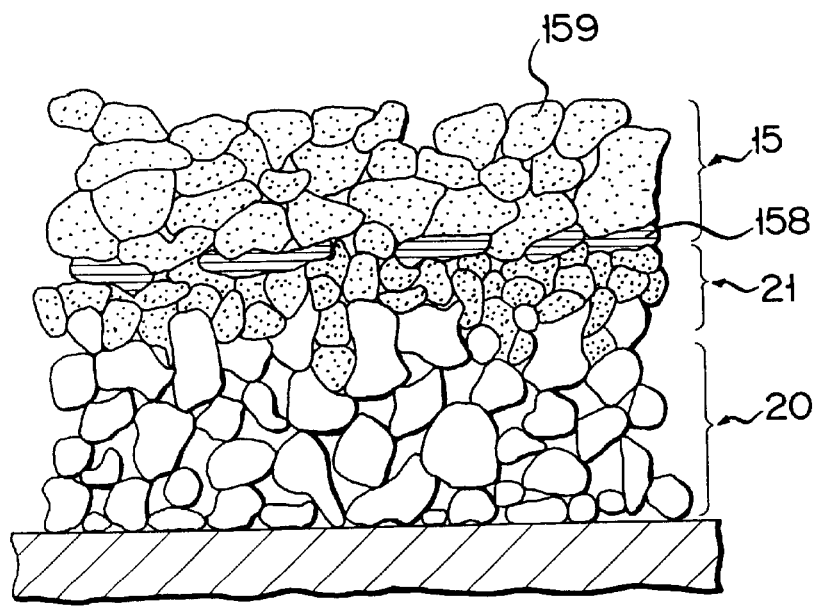
F I G. 6B

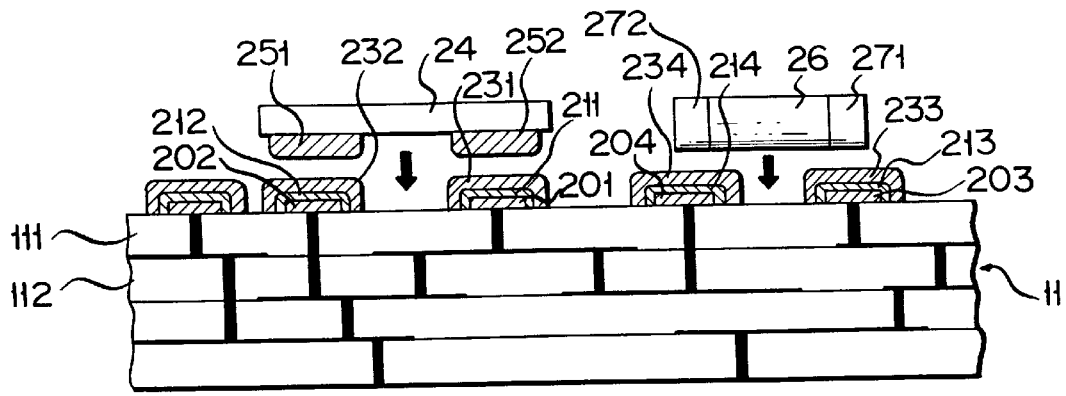
F I G. 7
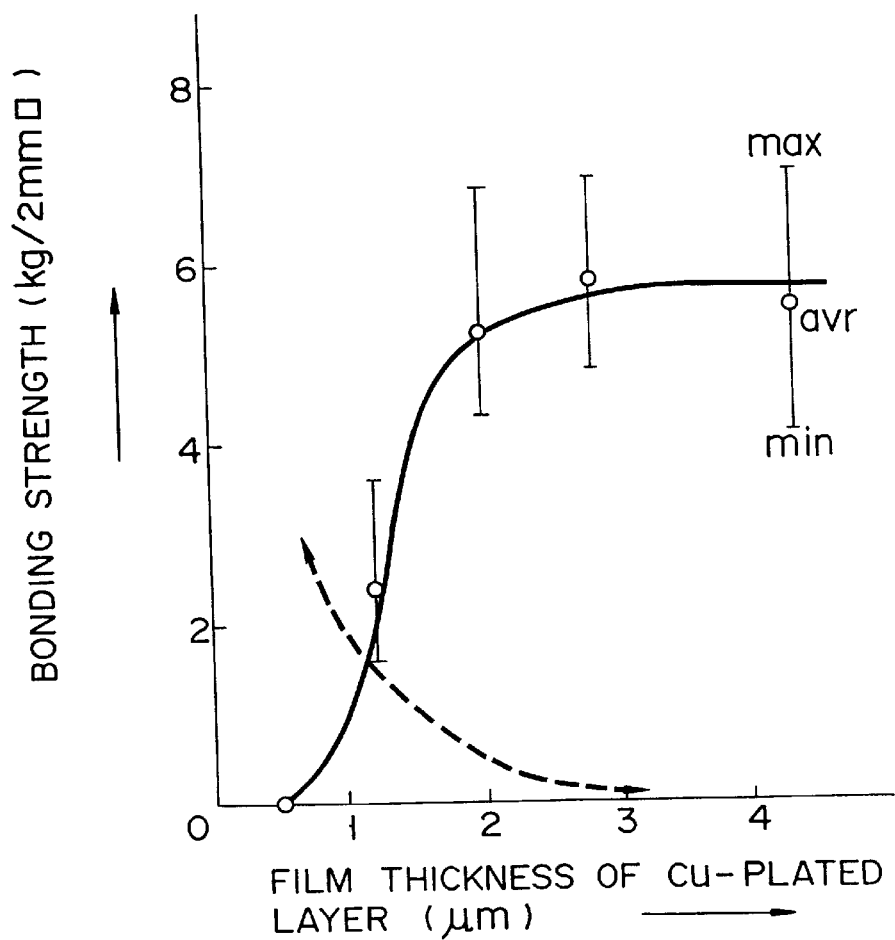
F I G. 8

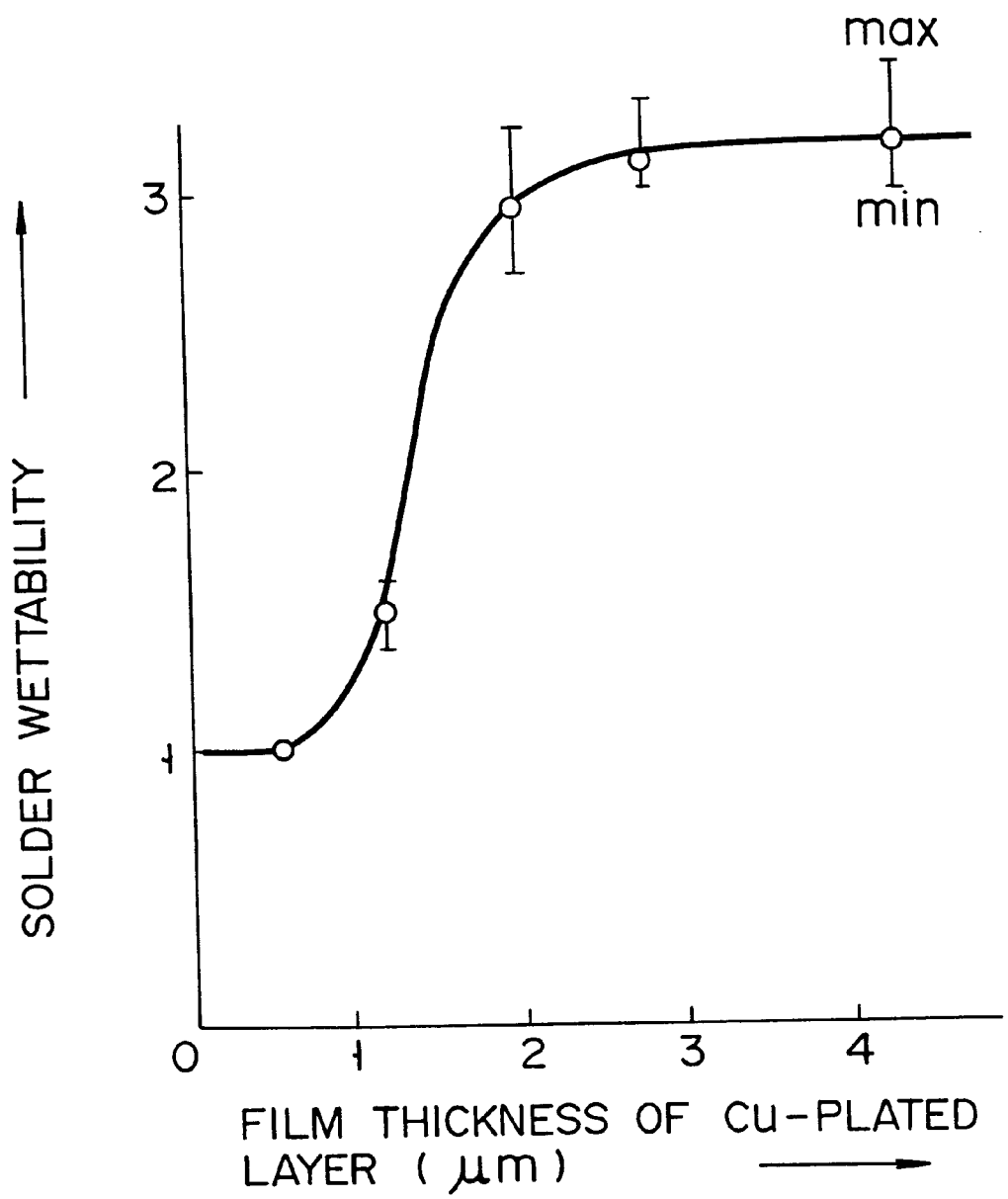
F I G. 9

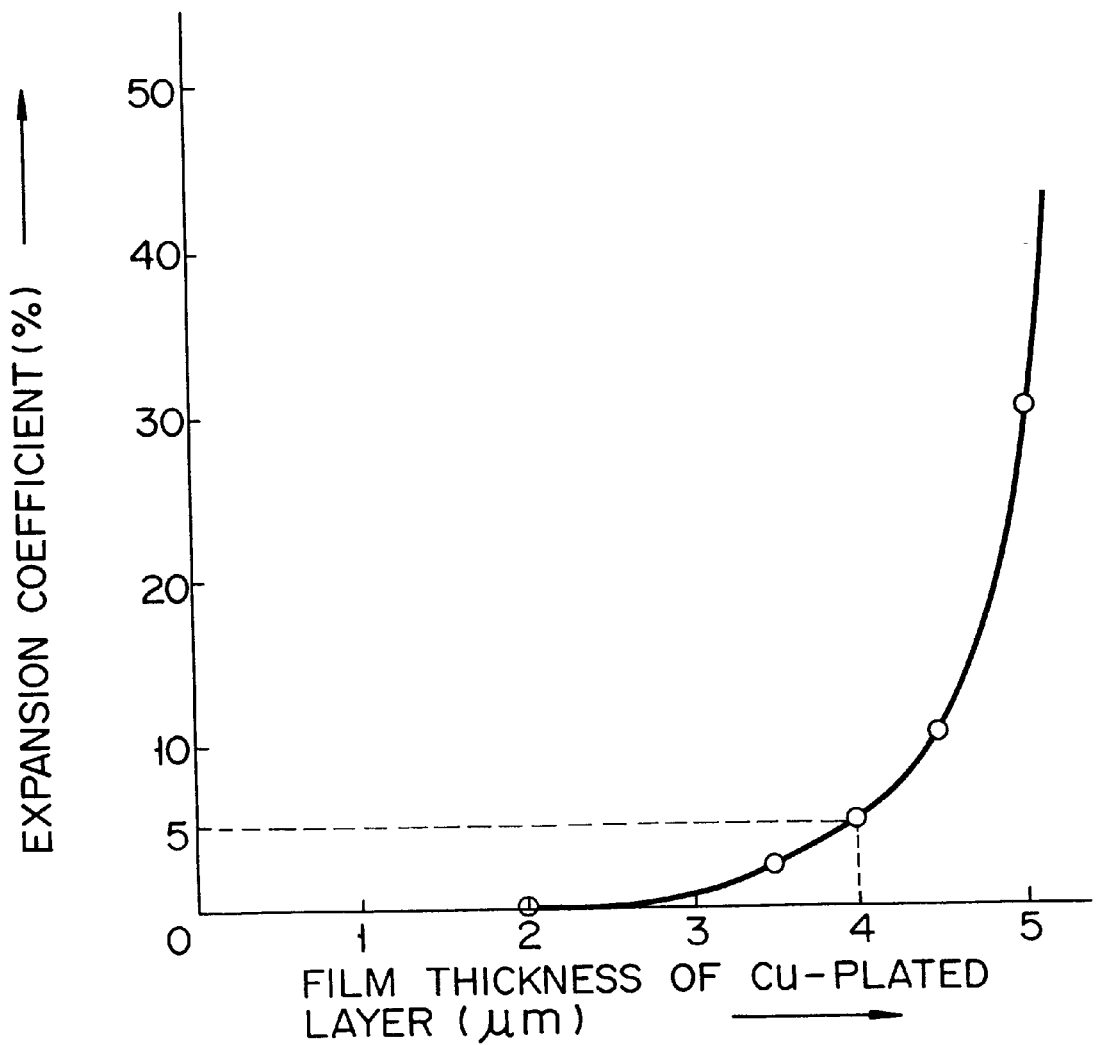
F I G. 10

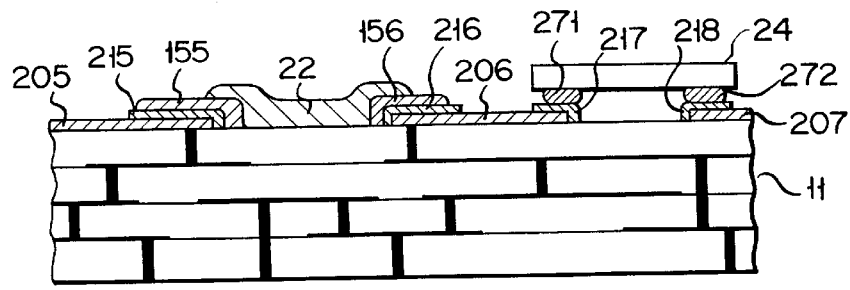
F I G. 11
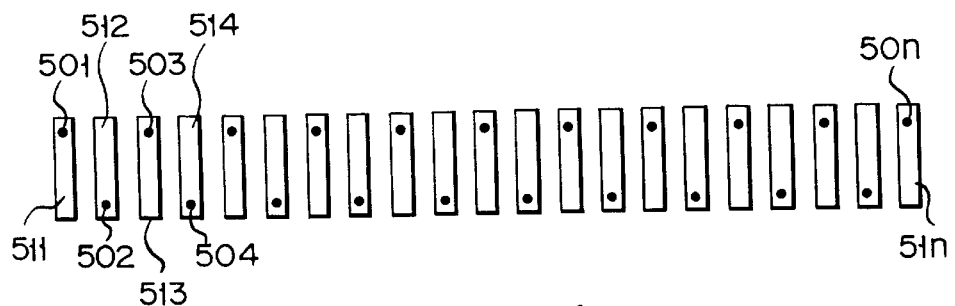
F I G. 12A
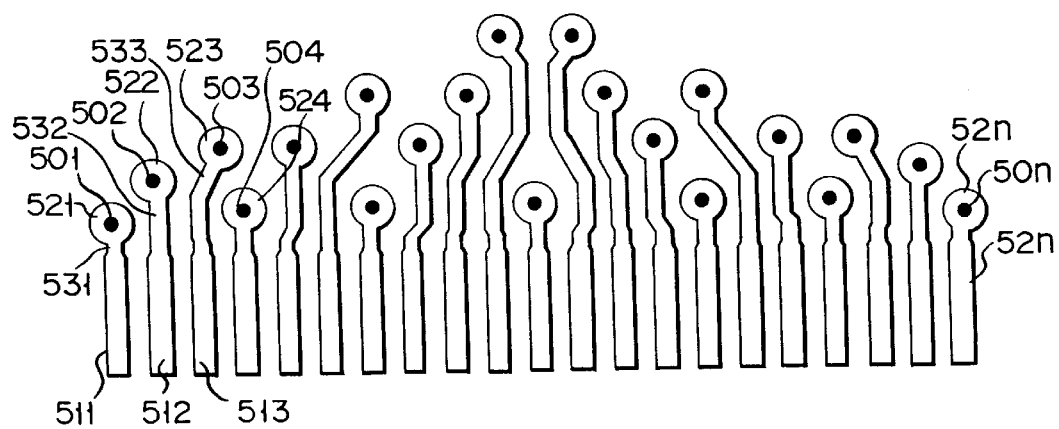
F I G. 12B

METHOD OF PRODUCING A HYBRID INTEGRATED CIRCUIT

This is a continuation of application Ser. No. 08/325,608, filed on Oct. 19, 1994, which was abandoned upon the filing hereof which was a divisional application of Ser. No. 08/089,606, filed July 12, 1993, now U.S. Pat. No. 5,383,093, which was a continuation of Ser. No. 07/275,710 filed Nov. 28,1988, now abandoned, which was a continuation of Ser. No. 07/050,033, filed May 15, 1987, now abandoned.

BACKGROUND OF THE INVENTION

The present invention relates to a method for manufacturing a hybrid integrated circuit in which circuit elements such as a thick film resistor are formed on a substrate constituted by sintering, e.g., an alumina green sheet and, more particularly, to a method for manufacturing a hybrid integrated circuit in which a terminal conductor is formed on a substrate surface so as to connect, e.g. a thick film resistor.

A substrate constituting a hybrid integrated circuit is constituted by printing a refractory conductor material such as tungsten (W) and molybdenum (Mo) to form a wiring conductor and baking the resultant substrate on which the conductor material if printed in a reducing atmosphere at a temperature of about 1,600° C. Thereafter, circuit elements such as a thick film resistor and a flip chip are formed on the baked alumina substrate.

Conventionally, in order to form, e.g., the thick film resistor on the alumina substrate, a silver-based conductor such as an Ag, Ag—Pt, or Ag—Pd conductor is formed as the terminal conductor on a printed conductor material constituting the wiring conductor, and then a thick film resistor layer is formed such that it is electrically connected to the terminal conductor.

The above substrate is sometimes constituted by a multilayer substrate obtained by laminating a plurality of substrates, and forming wiring layers made of the above-mentioned refractory conductor material therebetween. In such a multilayer substrate, conductor materials serving as conductor wiring formed inside the substrate are electrically connected to flip chips and the like in a manner as shown in FIG. 1, In FIG. 1, multilayer substrate 11 is constituted by laminating a plurality of substrates 111, 112, . . . , and wiring conductor layer 12 is formed therebetween, as required. In order to electrically connect layer 12 to the surface of substrate 11, through-hole 13 is formed in uppermost substrate 111, and conductor 14 is filled with nickel, gold, or the like, in hole 13 so that the surface of conductor 14 is substantially flattened to obtain the same surface level as that of substrate 11. For example, thick film conductor 15 is formed on the surface of substrate 11 by printing, and layer 12 and conductor 15 are electrically connected to each other by conductor 14. Conductor 15 serves as a terminal conductor, and, a flip chip for example is mounted thereon by soldering (Pb—Sn), and the flip chip and layer 12 are electrically connected to each other. In addition, a thick film resistor (not shown) is formed on substrate 11 as required so as to partially overlap the above thick film conductor.

In order to form the thick film resistor on substrate 11, conductor 15, serving as a terminal conductor and a resistor material layer for forming the thick film resistor, are baked in air at about 850° C. To prevent conductor 15 form being oxidized during the baking, precautions must be taken. For example, an Au film is formed on the surface of the conductor 15. The use of Au film results in high cost.

Furthermore, in the case of mounting a flip chip and the like on substrate 11, hole 13, formed in uppermost substrate 111 of substrate 11 is filled with a conductor. The surface of this conductor is smoothered so that conductor 15 which is formed on substrate 111, is continuous and has uniform thickness. In the case of forming the flip chip of soldering material on the surface of the conductor material constituting conductor 15, Ni- and Au-plated layers are formed between the solder and the conductor material. However, since Ni has a relatively strong tendency to become ionized, the surface of the conductor material must be activated by a catalyst when it is plated.

SUMMARY OF THE INVENTION

It is therefore an object of the present invention to provide a method for manufacturing a hybrid integrated circuit in which antioxidation of a conductor material, which constitutes a thick film conductor serving as a terminal conductor, to be formed on a multilayer substrate, can be performed without the need to use an expensive material such as Au, so that a thick film resistor or a solder on which a flip chip is mounted can be formed to be connected to the thick film conductor, thereby effectively connecting the resistor, the solder, and the like to the terminal conductor.

It is another object of the present invention to provide a highly reliable hybrid integrated circuit, wherein a contact resistance can sufficiently be decreased, especially in a bonding portion between the terminal conductor and the thick film conductor or the flip chip, and the strength of the bonding portion can be sufficiently improved.

It is still another object of the present invention to provide a hybrid integrated circuit, wherein the surface of the terminal conductor can be protected from oxidation, through use of a metal material having a relatively weak tendency to become ionized, so that in the case of forming the thick film resistor or the solder for mounting the flip chip thereon, the surface of the conductor material constituting the terminal conductor need not be activated, thereby simplifying the manufacturing steps.

More specifically, in the method according to the present invention, a thick conductor serving as a terminal conductor film is printed on the surface of a multilayer substrate constituted by sintering, this conductive material has a melting point higher than the sintering temperature of the multilayer substrate. In addition, a copper-plated layer is formed on at least a portion of the conductive material. Furthermore, the thick conductor film is baked in a nitrogen atmosphere so that at least a portion thereof is formed on the plated layer portion.

That is, in the hybrid integrated circuit having the above arrangement, antioxidation of the conductor material constituting the terminal conductor is performed on the copper-plated layer, and the copper forming the plated layer is easily precipitated since it has a relatively low ionization tendency, so that the surface of the conductive material is not activated by a catalyst. In addition, since the thick film conductor layer formed on the substrate is baked in a nitrogen atmosphere, oxidation of the conductive material can be more reliably prevented, thereby effectively improving the reliability of the hybrid integrated circuit.

BRIEF DESCRIPTION OF THE DRAWINGS

FIG. 2 is a sectional view of a multilayer substrate portion of a hybrid integrated circuit manufactured according to an embodiment of the present invention;

FIG. 2A is an enlarged sectional view of a part of the multilayer substrate shown in FIG. 2;

FIG. 5A is a schematic view of a sectional structure in which a thick film conductor layer of copper is formed directly on a conductor material;

FIG. 5B is the schematic sectional view of a resultant structure obtained when the structure shown in FIG. 5A is baked;

FIG. 6A is a schematic sectional view of a structure in which a copper-plated layer is formed on the conductor material;

FIG. 6B is the schematic sectional view of a resultant structure obtained when the structure shown in FIG. 6A is baked;

FIG. 7 is a sectional view for explaining an arrangement of a multilayer substrate of a hybrid integrated circuit manufactured according to a second embodiment of the present invention;

FIG. 8 is the graph of a relationship between a film thickness and the bonding strength of the copper-plated layer;

FIG. 9 is a graph illustrating a relationship between the film thickness and solder wettability of the copper-plated layer;

FIG. 10 is a graph illustrating a relationship between the film thickness and an expansion coefficient of the copper-plated layer;

FIG. 11 is a sectional view for explaining a third embodiment of the present invention; and FIGS. 12A and 12B are views respectively showing arrangements of the copper-plated layers and conductor patterns on the multilayer substrates.

DETAILED DESCRIPTION OF THE PREFERRED EMBODIMENTS

Figure 1:
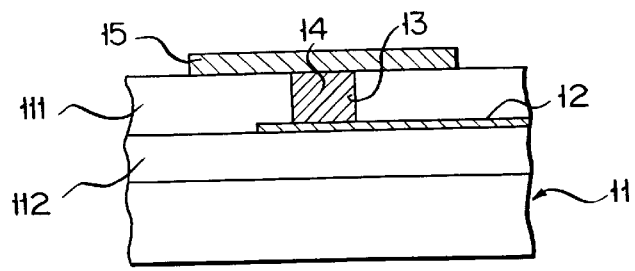
FIG. 1 is a sectional view explaining a conventional hybrid integrated circuit apparatus.

Multilayer substrate 11 shown in FIG. 2 is constituted by laminating a plurality of sheet substrates 111, 112, ..., each of which is a ceramic green sheet containing 90 to 95% of an alumina ceramic. Conductive layers 121, 122, ... respectively, made of a refractory metal material such as Mo (having melting point of 2,622° C.) or W (having melting point of 3,382° C.), are formed on the ceramic green sheets constituting substrates 111, 112, ... A plurality of the ceramic green sheets, on which layers 121, 122, ... are formed are laminated by a conventionally known layer laminating methods or a printing method to constitute substrate 11.

In the case where the layer laminating method is adopted, layers 121, 122, ... are respectively printed beforehand on a plurality of ceramic green sheets to be laminated. Thereafter, the sheets are laminated via-fill insertion or the like, and are then baked in a reducing atmosphere at about 1,600° C., thereby constituting one multilayer substrate 11. In this case, through holes are formed so as to enable substrates 111, 112, ... to be connected with layers 121, 122, ..., respectively, and as is partially shown in FIG. 2a, the respective through holes are filled with conductors 141, 142, .... In addition, conductive material layers 201 and 202 are formed on the surface of uppermost substrate 111, so as to correspond to conductors 141 and 142 filled in through holes.

Copper (Cu)-plated layers 211 and 212 are formed on the surface of substrate 11 so as to cover the exposed surfaces of conductive material layers 201 and 202, respectively. Layers 211 and 212 may be formed by an electroless plating such as chemical copper plating method.

After copper-plated layers 211 and 212 are thus formed, thick film conductive layers 151 and 152 serving as terminal conductors are formed so as to cover copper-plated layers 211 and 212, respectively, and thick film resistor layer 22 is formed so as to connect conductive layers 151 and 152. Layers 151 and 152 are formed by means of, for example, copper printing. Thereafter, layers 151 and 152 and resistor layer 22 are baked in a nitrogen atmosphere.

In this case, sintering is required in order to ensure contact between copper-plated layers 211 and 212 and conductive material layers 201 and 202. However, in this embodiment, copper-plated layers 211 and 212 are simultaneously heated during the baking of resistor layer 22 and conductive layers 151 and 152, and are therefore in the same state as that of sintering.

When the terminal conductor is formed on the surface of substrate 11 as described above, oxidation of conductive material layers 201 and 202 can be reliably prevented, because conductive layers 151 and 152 and resistor layer 22 are baked in a nitrogen atmosphere. Copper-plated layers 211 and 212 serve as bonding inter-layers for electrically connecting conductive material layers 201 and 202 with resistor layer 22. The contact resistances of layers 211 and 212 are relatively small, as is represented by property A in FIG. 3. In addition, the bonding strength of portions corresponding to layers 211 and 212 is increased, as is represented by property A in FIG. 4, and this bonding strength will remain at a high level even after an extended period of time.

Figure 3:
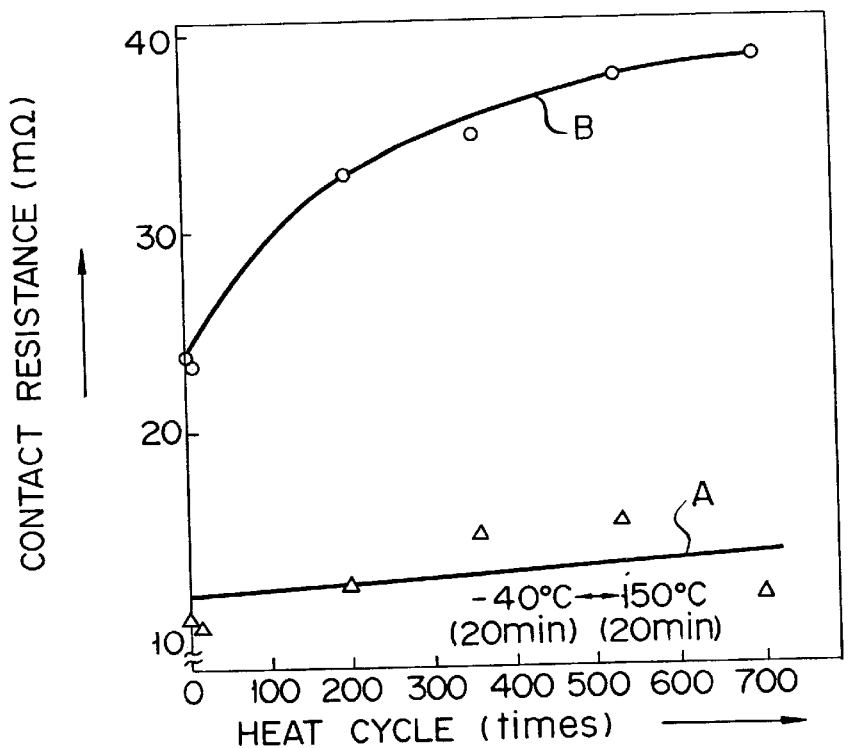
FIG. 3 is the graph of a relationship between a contact resistance and the heat cycle in a terminal conductor portion of the hybrid integrated circuit apparatus.
Figure 4:
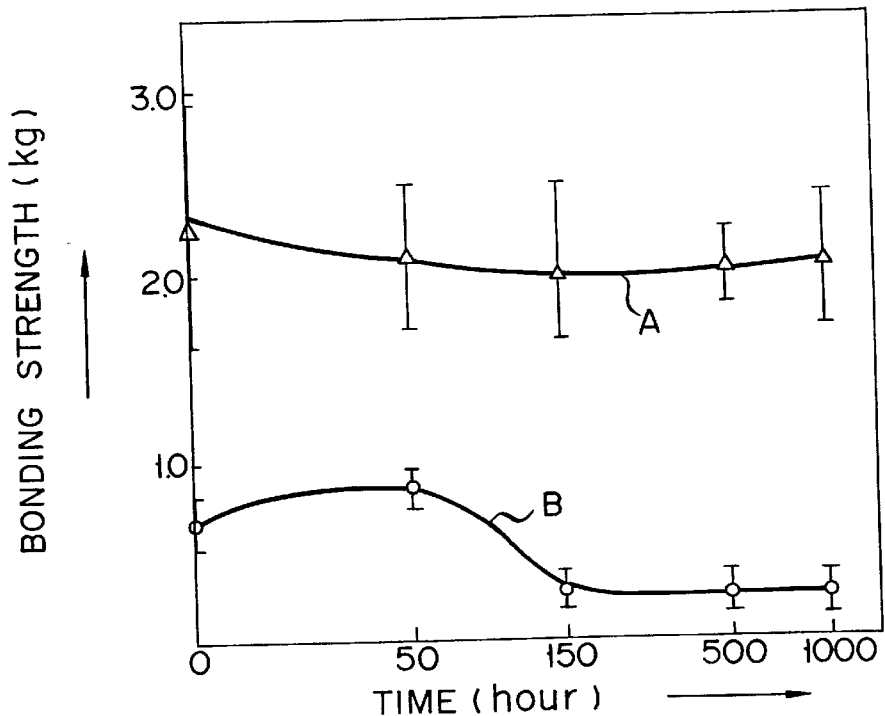
FIG. 4 is a graph of the deterioration in the bonding strength over a period of time.

Note that the values shown in FIG. 3 were obtained as a result of one heat cycle of –40° C. for 20 min and 150° C. for 20 min, and that properties B in FIGS. 3 and 4 are obtained when the copper-plated layer is not formed, i.e., layers 151 and 152 are formed directly on conductors 141 and 142.

As is described above, by interposing copper-plated layers 211 and 212 between conductive material layers 201, 202 and conductive layers 151, 152, the contact resistance is decreased and the bonding strength of the bonded portion is improved for the following reason.

FIG. 5A shows the case in which thick film conductive layer 15 is laminated directly on conductive material layer 20 without forming a copper-plated layer. As illustrated in FIGS. 5A–5B and 6A–6B, the conductive layer 20 is formed by a porous conductive material containing particles of different sizes. Although the material constituting layer 20 is normally porous, the size of copper particles 159, constituting layer 15, is about 0.1 to 5 $\mu$m, and hence particles 159 cannot enter the material forming layer 20. In addition, layer 15 comprises glass 158 such as a Bi, B, or Si glass, so as to ensure a high level of adhesive strength between layer 15 and substrate 11 and, glass 158 reaches the interface between conductive material layer 20 and conductive layer 15, as shown in FIG. 5B, during baking of layer 15 Hence, glass 158 impairs the adhesion between conductive material layer 20 and conductive layer 15.

FIG. 6A shows the state in which copper-plated layer 21 is formed between conductive material layer 20 and conductive layer 15. Copper (Cu) ions contained in layer 21 have a relatively high reducing power and hence can be easily precipitated. Those ions are relatively small particles 219 with a size of 0.1 to 0.2 μm, and hence can enter deeply into porous conductive material layer 20 during the plating. Therefore, after the baking of conductive layer 15 has been completed, copper-plated layer 21 is intertwined and bonded on the bonding surface portion, thereby increasing the bonding strength. Furthermore, since no glass layer is formed between layer 21 and layer 20, the contact resistance in this portion is low.

During the destructive test performed by the present inventor, peeling occurred between copper-plated layer 21 and conductive material layer 20. Therefore, it is believed that a primary factor responsible for a decrease in the bonding strength in this portion is not glass 158 formed between copper-plated layer 21 and conductive layer 15, but gaps 209 shown in FIG. 5B.

FIG. 7 shows a second embodiment of the present invention, in which a flip chip is formed. In FIG. 7, the same parts as in FIG. 2 are denoted by the same reference numerals, and a detailed description thereof will be thus omitted.

In the second embodiment, copper-plated layers 211 and 212 are formed so as to cover conductive material layers 201 to 202, respectively, and solder layers 231 and 232 being formed so as to cover layers 211 and 212, respectively. Layers 231 and 232 are respectively adhered to electrodes 251 and 252 of flip chip 24, so that chip 24 is connected to multilayer substrate 11.

In addition, in the second embodiment, conductive material layers 203 and 204 are formed, copper-plated layers 213 and 214 are respectively formed thereon, and solder layers 233 and 234 is respectively formed on layers 213 and 214. Furthermore, electrodes 271 and 272 of the discrete element 26, e.g., a capacitor, is adhered to layers 233 and 234, respectively, so that element 26 is connected to substrate 11.

With the above arrangement, similar to that of the first embodiment, the contact resistance is decreased and the bonding strength is improved in conductive material layers 201 to 204, and the following effects can be additionally obtained.

When solder layers 231 to 234 are melted to mount chip 24 and element 26, the temperature thereof becomes about 250° C. For this reason, it is believed that conductive material layers 201 to 204 are oxidized to some extent. However, since layers 201 to 204 are coated with copper-plated layers 211 to 214, respectively, oxidation of layers 201 to 204 is effectively prevented.

In addition, when copper-plated layers 211 to 214 are formed, the copper thereof can be easily precipitated because of its relatively weak tendency to become ionized. For this reason, the surface of the conductive material does not need to be activated by, for example, a catalyst, thereby effectively simplifying the manufacturing steps. Furthermore, if an Ni-plated layer is formed on the surface of the conductive material, as is conventionally known and is oxidized, it is difficult to remove this oxide since to do so requires the use of a strong acid. A copper oxide can be easily removed.

In a conventional multilayer substrate, conductors are filled by putting, for example, Ni plating or Au plating into the through holes formed in the uppermost sheet substrate, so that the conductors are electrically connected to a thick film conductor formed on the surface of the substrate.

However, in the case of substrate 11 constituting the hybrid integrated circuit apparatus according to the present invention, conductive material layers 201 and 202 are formed on the surface of substrate 11, which the conductors formed in the through-holes are exposed to the surface of substrate 11. Therefore, no step is formed between the surfaces of the through hole portions and substrate 11, and the area of conductive material layers 201, 202, . . . exposed on the surface of substrate 11 can be increased, thereby improving the bonding strength of copper-plated layers 211, 212, . . . .

In addition, when the through holes are plated with Ni, to form conductors, a Ni-plated layer must be formed to a thickness corresponding to that of the sheet substrate in the portions of the through holes. It is however, difficult to ensure the accuracy of the thickness of this layer by use of electroless plating. On the other hand, when electrolytic plating is performed, electrical wiring must be formed in the substrate.

In contrast, copper-plated layers 211, 212, . . . shown in the second embodiment do not have to be such a thickness, therefore, relatively thin plated layers do not pose any substantial problem.

Note that in the conventional apparatus, a diameter of the through holes may be increased so as to increase the bonding strength between the conductive material layers and the plated layers formed in the through holes. However, with this arrangement, a difference between the thermal expansion coefficients of the plated metal and the substrate cannot be neglected.

In both the first embodiment and the second embodiment the strength of the bonding between the conductive material layers can be increased by adjusting the thickness of copper-plated layers 211, 212, . . . .

FIG. 8 shows results obtained by testing the state of bonding strength in relation to the thickness of the copper-plated layer, in which the bonding strength between the copper-plated layer and a thick film conductor constituted by tungsten was measured. As is apparent from the test result represented by a solid line, it is confirmed that the bonding strength is increased when the thickness of the copper-plated layer is about 2 μm or more.

In addition, when the bonding strength and the film thickness assume such relationship as is represented by a broken line in FIG. 8, the copper-plated layer will have black spots, due to the tungsten exposed on a part of the surface of the copper-plated layer. When the thickness of the copper-plated layer is about 2 μm or less, generation of the dots increases, thereby degrading the solder wettability of the copper-plated layer since the solder cannot attach itself to tungsten.

FIG. 9 shows a relationship between the thickness and the solder wettability of the copper-plated layers. When the thickness of the copper-plated layer exceeds 2 μm, good solder wettability can be obtained.

Assuming that the diameter of the solder before heating it is r1 and that after heating is r2, solder wettability R is represented by "R=r2/r1".

FIG. 10 shows a result obtained by testing the expansion coefficient of the copper-plated layer, in which the abscissa represents the film thickness of the copper-plated layer and the ordinate represents the expansion coefficient (%), as a ratio of areas of a portion where the copper-plated layer is well-formed, and an expanded portion.

In this test, tungsten is used as conductive material layer 20 having a size of "2.1×0.65 mm", the copper-plated layer being formed thereon. In this case, if the expansion coefficient is 5% or less, this poses no significant problem. Therefore, it is confirmed from the test result that when the film thickness of the copper-plated layer is about 4 μm or less, a satisfactory result can be obtained.

As is apparent from the test results shown in FIGS. 8 to 10, it was found that the film thickness of copper-plated layer 21 formed on conductive material layer 20, i.e., the film thickness represented by t in FIG. 2a should desirably be set within the range of about 2 to 4 μm. Note that in FIGS. 8 and 9, each of the circles indicate an average value of the bonding strength and the solder wettability by carrying out measurements several times under the same conditions, and in FIGS. 8 and 9 are shown the ranges of maximum (max) and minimum (min) values actually measured.

Note that in the second embodiment, substrate 11 is shown as a multilayer structure. However, if substrate 11 is constituted by a single substrate, the present invention can be applied without modifications. In addition, as for a terminal conductor, connected to a wiring conductor and formed on substrate 11, a structure in which the copper-plated layer is formed on the surface of the conductive material can be adopted without modifications.

FIG. 11 shows a third embodiment of the present invention, in which conductive material layers 205, 206, and 207 are formed on multilayer substrate as wiring means for forming a circuit on the surface of multilayer substrate 11 constituted in the same manner as in the first and second embodiments. Copper-plated layers 215 to 218 are formed so as to cover portions of layers 205 to 207, respectively. In addition, thick film conductive layers 155 and 156 are respectively formed on copper-plated layers 215 and 216. Thick film resistor layer 22 is formed so as to connect conductive layers 155 and 156. Furthermore, solder layers 272 and 272 are formed on copper-plated layers 217 and 218, so that flip chip 24 is supported by layers 217 and 218.

That is, the copper-plated layers do not have to be formed such that they cover the entire surface of the conductive material layers, but need only be formed on the thick film layers required to connect circuit elements or on those portions of the conductive material layers on which solder layers required to mount a flip chip will be formed.

In the case wherein the portions of the conductive material layers are not covered with the copper-plated layers and the like but are exposed then if the exposed surfaces are coated with, for example, epoxy resin, oxidation can be effectively prevented. In addition, when solder is melted in a reducing gas (e.g., nitrogen) atmosphere, antioxidation can be satisfactorily achieved.

FIG. 12A shows a circuit pattern formed on a multilayer substrate. When copper-plated layers 501, 502, . . . respectively, are formed on a plurality of conductive material layers, serving as terminal conductors, they are arranged at equal intervals, solder layers 511, 512, . . . are formed parallel to each other from the respective positions of layers 501, 502, . . . so as to form elongated rectangular patterns. In addition, rectangular bumps of a flip chip are connected to the solder layers in the rectangular patterns.

More specifically, as shown in FIG. 12B, when copper-plated layers 501, 502, . . . are arranged at relatively large intervals, conductive layer 521, 522, . . . are formed in relatively large areas in correspondence to portions of layers 501, 502, . . . , respectively, so that conductive layers 521, 522, . . . are connected to portions of solder layers 511, 512, . . . , formed parallel to each other in elongated rectangular patterns, respectively through conductive layers 531, 532, . . . . In addition, bumps on flip chip are connected to portions of solder layers 511, 512.

FIG. 12B shows that patterns of conductive layers 521, 522, . . . can be formed in relatively large areas on portions where copper-plated layers 501, 502, . . . are formed. As a result, the positions of the solder layers may change, because of a difference in the extents between sintering of the multilayer substrate and the conductive material layers, resulting in difficult alignment between the flip chip and the bump. However, as shown in FIG. 12B, if relatively large conductive layers 521, 522, . . . are formed in portions where the copper-plated layers are to be formed, the above positional changes of the solder layers occurring during sintering can be reduced. Furthermore, in the pattern shown in FIG. 12B, since solder layers 512, 512, . . . are formed separate from copper-plated layers 501, 502, . . . , layers 501, 502, . . . are not directly subjected to thermal and mechanical influences when bumps are mounted on solder layers 511, 512, . . . , thereby effectively improving the reliability of the hybrid integrated circuit apparatus.

What is claimed is:

1. A method for producing a hybrid integrated circuit, the method comprising the steps of:

providing a sintered substrate member;

providing a porous conductive material containing particles of different sizes on the sintered substrate member;

forming a plated layer of copper directly on at least a portion of the porous conductive material thereby preventing exposure of the portion, said plated layer of copper having a thickness from 2 to 4 μm and extending to the surface of the sintered substrate member; and forming a conductor layer on the layer of copper thereby providing at least one terminal portion for a circuit element associated with the sintered substrate member.

2. A method for producing a hybrid integrated circuit according to claim 1, wherein the step of providing a sintered substrate member further includes providing a plurality of sheet substrates each of which is a green sheet and laminating the plurality of sheet substrates to define a multilayer sintered serving as the sintered substrate member.

3. A method for producing a hybrid integrated circuit according to claim 1, wherein the step of providing a sintered substrate member includes:

providing a plurality of ceramic green sheets containing through holes;

printing conductive layers on the plurality of green sheets such that a first portion is formed on an outermost layer of the sintered substrate member;

laminating the plurality of green sheets so that the conductive layers are connected; and sintering the laminated green sheets to define the sintered substrate member.

4. A method for producing a hybrid integrated circuit according to claim 1, wherein the step of providing a sintered substrate member includes:

providing a plurality of ceramic green sheets containing 90% to 95% alumina ceramic and containing through holes;

printing a conductive layer of one of tungsten and molybdenum on the plurality of green sheets such that a first portion is formed on an outermost layer of the sintered substrate;

laminating the plurality of green sheets by viafill insertion so that the conductive layers are connected; and sintering the laminated green sheets in a reducing atmosphere at about 1600° C. to form the sintered substrate member.

5. A method for producing a hybrid integrated circuit according to claim 1, wherein the step of forming the layer of copper includes forming the layer of copper on an entire surface of the porous conductive material.

6. A method for producing a hybrid integrated circuit according to claim 1, wherein the layer of copper is formed by electroless plating.

7. A method for producing a hybrid integrated circuit according to claim 6, wherein the electroless plating step is chemical copper plating.

8. A method for producing a hybrid integrated circuit according to claim 1, wherein the porous conductive material has a melting point higher than a sintering temperature of the sintered substrate member.

9. A method for producing a hybrid integrated circuit according to claim 1, wherein the step of forming a conductor layer includes a step of forming a first conductor layer on another portion of the sintered substrate, further comprising a step of connecting the conductor layer and the first conductor layer with a thick film resistor layer.

10. A method for producing a hybrid integrated circuit according to claim 1, further comprising the step of sintering the conductor layer in a nitrogen atmosphere.

11. A method for producing a hybrid integrated circuit according to claim 1, wherein the step of forming the conductor layer is performed by copper printing.

12. A method for producing a hybrid integrated circuit according to claim 1, wherein the conductor layer is solder.

13. A method for producing a hybrid integrated circuit according to claim 12, further comprising the step of attaching the circuit element to the sintered substrate member such that the circuit element is operatively connected to said solder layer.

14. A method for producing a hybrid integrated circuit, the method comprising the steps of:

providing a sintered substrate member;

providing a porous conductive material on said sintered substrate member;

forming a plated layer of copper directly on at least a portion of the porous conductive material thereby preventing exposure of the portion, wherein the layer of copper is formed to a thickness in the range of 2 to 4 $\mu$m; and forming a conductor layer on the layer of copper thereby providing at least one terminal portion for a circuit element disposed on the sintered substrate member, said conductor layer being formed so as to cover an upper surface and side surfaces of said plated layer of copper and to extend to the surface of said substrate.

* * * * *